United States Patent [19]

Ramaswamy et al.

[11] Patent Number: 5,497,401
[45] Date of Patent: Mar. 5, 1996

[54] BRANCH METRIC COMPUTER FOR A VITERBI DECODER OF A PUNCTURED AND PRAGMATIC TRELLIS CODE CONVOLUTIONAL DECODER SUITABLE FOR USE IN A MULTI-CHANNEL RECEIVER OF SATELLITE, TERRESTRIAL AND CABLE TRANSMITTED FEC COMPRESSED-DIGITAL TELEVISION DATA

[75] Inventors: Kumar Ramaswamy; John S. Stewart, both of Indianapolis, Ind.

[73] Assignee: Thomson Consumer Electronics, Inc., Indianapolis, Ind.

[21] Appl. No.: 342,280

[22] Filed: Nov. 18, 1994

[51] Int. Cl.$^6$ ................................................ H03M 13/12
[52] U.S. Cl. .................... 375/341; 375/262; 371/37.8; 371/43
[58] Field of Search .................................... 375/262, 340, 375/341; 371/37.8, 43, 46; 348/726

[56] References Cited

U.S. PATENT DOCUMENTS

| | | | |
|---|---|---|---|
| 4,536,878 | 8/1985 | Rattlingourd et al. | 371/43 |
| 4,748,626 | 5/1988 | Wong | 375/262 |
| 4,805,174 | 2/1989 | Kubota et al. | 371/43 |
| 5,150,369 | 9/1992 | Costa et al. | 371/43 |
| 5,202,903 | 4/1993 | Okanoue | 375/341 |
| 5,233,629 | 8/1993 | Paik et al. | 375/262 |
| 5,331,666 | 7/1994 | Dent | 375/341 |

OTHER PUBLICATIONS

*Preliminary Data Bulletin for the Q1875 Trellis Decoder*, Qualcomm Incorporated, VLSI Products Division, San Diego, Calif.

"Development of Variable Rate Viterbi Decoder and its Performance Characteristics", Proceedings of the 6th ICDSC Conference, Phoenix, Arizona, 1983, pp. XII-24–XII-31.

"A 25 MHz Viterbi FEC Codec" by Kerr et al., IEEE 1990 Custom Integrated Circuits Conference, pp. 13.6.1–13.6.5.

"Practical Coding for QAM Transmission of HDTV" by Heegard et al., IEEE Journal on Selected Areas in Communications, Jan. 1993, pp. 111–118.

"Forward Error Correction Applied to Intelsat IDR Carriers" by Morley, International Journal of Satellite Communications, vol. 6, 1988, pp. 439–454.

"45 Mbps Viterbi Decoder, STEL-2060", Stanford Telecommunications, Sunnyvale, Calif., 1992, 1993, pp. 1–15.

*Primary Examiner*—Young T. Tse
*Attorney, Agent, or Firm*—Joseph S. Tripoli; Eric P. Herrmann; Ronald H. Kurdyla

[57] ABSTRACT

A branch metric computer for the Viterbi decoder of a convolutional decoder primarily intended for use in a multi-channel compressed-digital television receiver capable of receiving FEC data transmitted over satellite, terrestrial and transmission channels. The branch metric computer employs a RAM, having an effective depth of $2^x$ storage locations and an effective storage-location width of 16 m, which is preloaded with two selectively programmed I and two selectively programmed Q lookup tables, wherein each table entry is made up of four m-bit values,. The RAM is designed to operate with either QPSK punctured-coded I and Q signal inputs or any one of a plurality of different PAM or QAM higher alphabet or an 8-PSK pragmatic trellis-coded $2^x$-bit I and $2^x$-bit Q signal inputs to the convolutional decoder that are forwarded as signal inputs to the RAM for controlling the particular I and Q lookup-table entries read out from the RAM. The branch metric computer further comprises (1) a group of eight Manhattan-distance metric computing summers organized into first and second sets of four summers for adding certain combinations of the four m-bit I and Q lookup-table entries read out from the RAM and (2) a network including four comparators with each of them forwarding to the Viterbi decoder the lesser sum output from corresponding ones of the summers of the first and second sets.

10 Claims, 5 Drawing Sheets

BRANCH METRIC COMPUTER FOR A VITERBI DECODER OF A PUNCTURED AND PRAGMATIC TRELLIS CODE CONVOLUTIONAL DECODER SUITABLE FOR USE IN A MULTI-CHANNEL RECEIVER OF SATELLITE, TERRESTRIAL AND CABLE TRANSMITTED FEC COMPRESSED-DIGITAL TELEVISION DATA

BACKGROUND OF THE INVENTION

1. Field of the Invention

The invention relates to digital processing apparatus suitable for use in a multi-channel receiver of satellite, terrestrial and cable transmitted forward-error-corrected (FEC) compressed-digital television data and, more particularly, to a branch metric computer for a Viterbi-algorithm based convolutional decoder capable of decoding either punctured or pragmatic trellis codes 2. Description of the Prior Art Known in the art is the use of forward-error-correction that includes convolutional encoding in the transmission of encoded digital data over a noisy channel from a transmitter to a receiver that includes a branch metric computer for a Viterbi-algorithm based convolutional decoder. The Viterbi Algorithm is used very commonly to decode a convolutionally encoded sequence of bits transmitted over a noisy channel. In the heart of the Viterbi algorithm is a series of repetitive add-compare-select operations which accept as input certain metrics (termed branch metrics) computed on each received symbol from the demodulator. For satellite, cable and terrestrial transmission of high data rate signals, such computations need to performed at very high rates. Furthermore, in a modem/decoder operating over different channels with different (but related) coding schemes, the cost of computing the branch metrics becomes excessive in terms of lookup table memory or actual hardware to perform these computations.

In the case of a satellite transmission channel, it is customary to transmit some particular punctured quaternary phase shift keyed (QPSK) code known to the receiver's convolutional decoder. In the case of a terrestrial or cable transmission channel, some particular pragmatic trellis code (such as quadrature amplitude modulation (QAM), phase amplitude modulation (PAM) or phase shift keyed (PSK) code) known to the receiver's convolutional decoder. For instance, the prior art discloses the use of a pragmatic trellis code as a practical code for QAM transmission of high definition television (HDTV).

In the past, the receiver including a branch metric computer for a Viterbi-algorithm based convolutional decoder was typically designed to operate with only a single predetermined type of convolutional code. However, it is likely that multi-channel digital television receivers will enter the mass-produced market in the near future and, over time, replace currently-used analog television receivers. Direct broadcast satellite transmission to television receivers is already available in addition to terrestrial and cable transmission thereto. Therefore, it is desirable that the convolutional decoders of such multi-channel digital television receivers be selectively responsive to the type of code (either punctured or pragmatic trellis, as the case may be) and the type of modulation (PSK including both QPSK and 8-PSK, PAM or QAM, as the case may be) of the channel then being received by the multi-channel digital television receiver.

Further, mass-produced television receivers should be designed with reduction in cost and complexity in mind.

SUMMARY OF THE INVENTION

The present invention is directed to an improvement in the branch metric computer for the Viterbi decoder of a convolutional decoder which is both more versatile in its operation and less complex and costly than prior branch metric computers. In a first embodiment, this branch metric computer may be selectively programmed to operate with any of QPSK punctured-coded and a plurality of PAM or QAM higher alphabet pragmatic trellis-coded I and Q signal inputs thereto. In a second embodiment, this branch metric computer may be additionally selectively programmed to also operate with 8-PSK trellis-coded I and Q signal inputs thereto.

More specifically, the present invention is directed to a branch metric computer having $2^x$-bit I and $2^x$-bit Q signal inputs. The branch metric computer comprises (1) a RAM having an effective depth of $2^x$ storage locations and a width sufficient to store 4-m bit wide entries of at least one preloaded I-defining and one Q-defining lookup tables at each storage location, (2) a group of at least four summers, and (3) means for forwarding the respective sum outputs from four summers of the group to the Viterbi decoder of the convolutional decoder.

In the second embodiment, the width of the RAM is sufficient to store 4-m bit wide entries of two preloaded I-defining and two Q-defining lookup tables at each storage location; the group of at least four summers comprises eight summers organized into first and second sets of four summers, and the means for forwarding the respective sum outputs from four summers of the group to the Viterbi decoder of the convolutional decoder includes four comparators with each of them forwarding to the Viterbi decoder the lesser sum output from corresponding ones of the summers of the first and second sets.

DESCRIPTION OF THE PREFERRED EMBODIMENT

Figure 1:
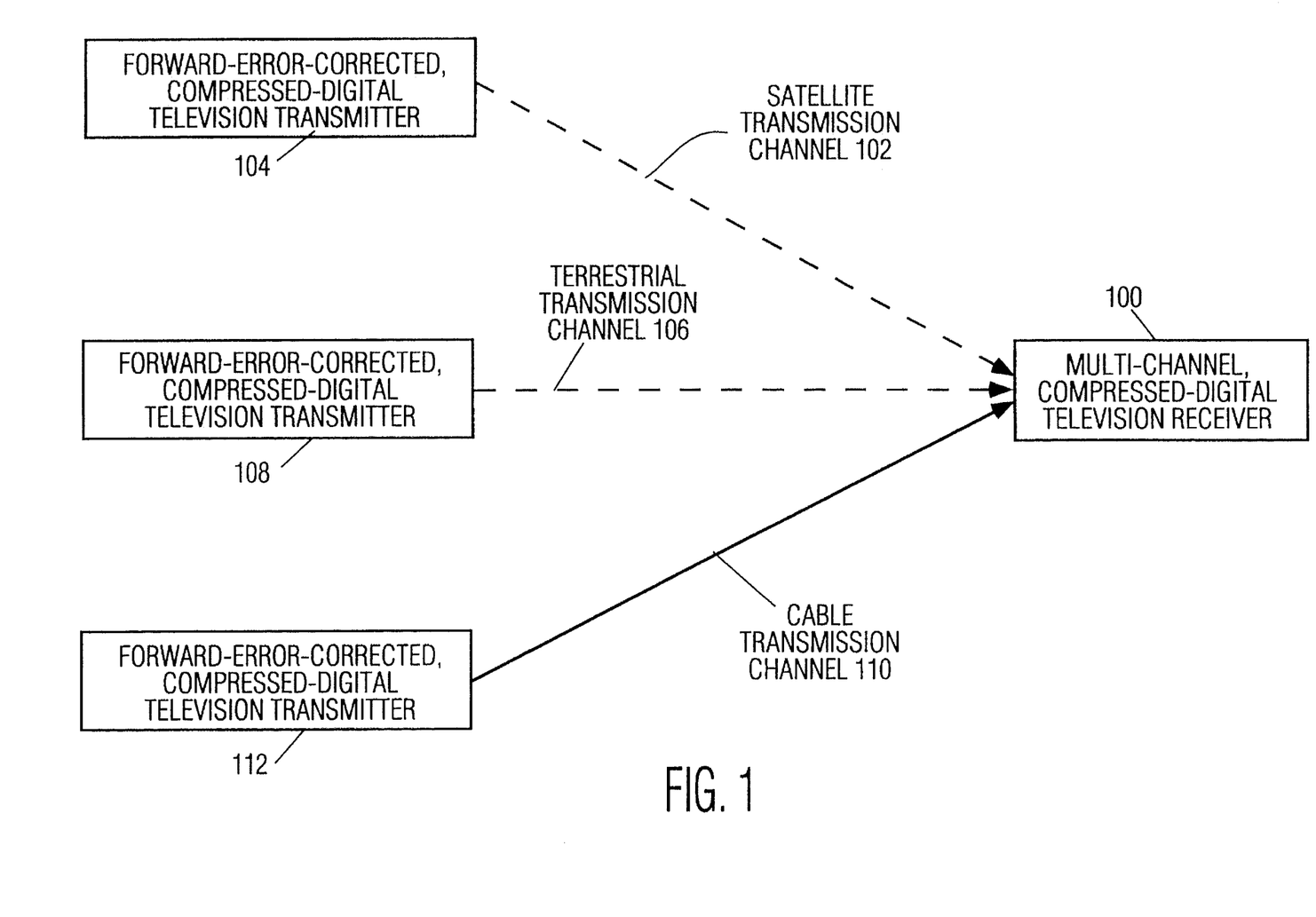
FIG. 1 illustrates the different types of transmission channels which may be received by a multi-channel compressed-digital television receiver transmitted from a forward-error-corrected compressed-digital television transmitter.

As shown in FIG. 1, multi-channel compressed-digital television receiver 100 is capable of selectively receiving digitally-encoded television data transmitted over each of a plurality of different channels. These plurality of channels include satellite transmission channel 102, which transmits digitally-encoded television data from forward-error-corrected television transmitter 104; terrestrial transmission channel 106, which transmits digitally-encoded television data from forward-error-corrected television transmitter 108; and cable transmission channel 110, which transmits digitally-encoded television data from forward-error-corrected television transmitter 112. As known in the art, forward-error-correction at the transmitter typically comprises convolutional encoding of successively-transmitted symbol packets of already encoded compressed-digital television data.

As further known in the art, while QSPK-based punctured codes are typically employed for transmission of convolutional encoded data over a satellite channel, higher alphabet (i.e., 8, 16, 32, 64, 128 and 256) n/n+1 pragmatic trellis codes are typically employed for PAM, PSK or QAM based transmission of convolutional encoded data over terrestrial or cable channels. Therefore, it is required that multi-channel receiver 100 incorporates a convolutional decoder that is capable of decoding any particular one of QSPK-based punctured or PAM, PSK or QAM based higher alphabet n/n+1 pragmatic trellis codes, depending on the selected one of the multi-channels then being received.

Figure 2:
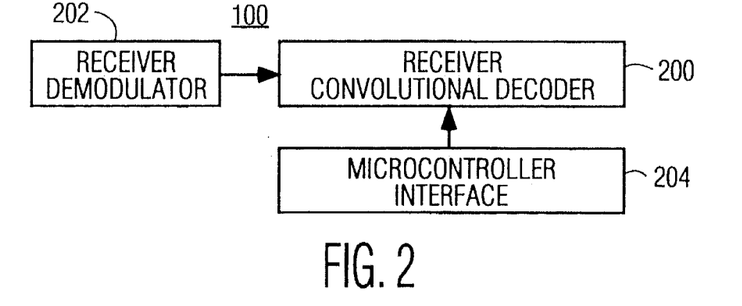
FIG. 2 is a block diagram showing the relationship among the convolutional decoder, the demodulator applying an input to the decoder, and a microcontroller interface to the decoder of the multi-channel compressed-digital television receiver of FIG. 1.

More specifically, multi-channel receiver 100 comprises digital processing apparatus which, as shown in FIG. 2, includes receiver convolutional decoder 200 and receiver demodulator 202 which, as known in the art, applies each of a series of successively-received convolutionally-encoded symbol packets as the signal input data to receiver convolutional decoder 200. Each successively-received symbol packet of this data defines a point in the in-phase (I), quadrature-phase (Q) plane The digital processing apparatus of multi-channel receiver 100 further comprises a microcontroller which includes microcontroller interface 204 for applying a control input to receiver convolutional decoder 200.

Figure 3:
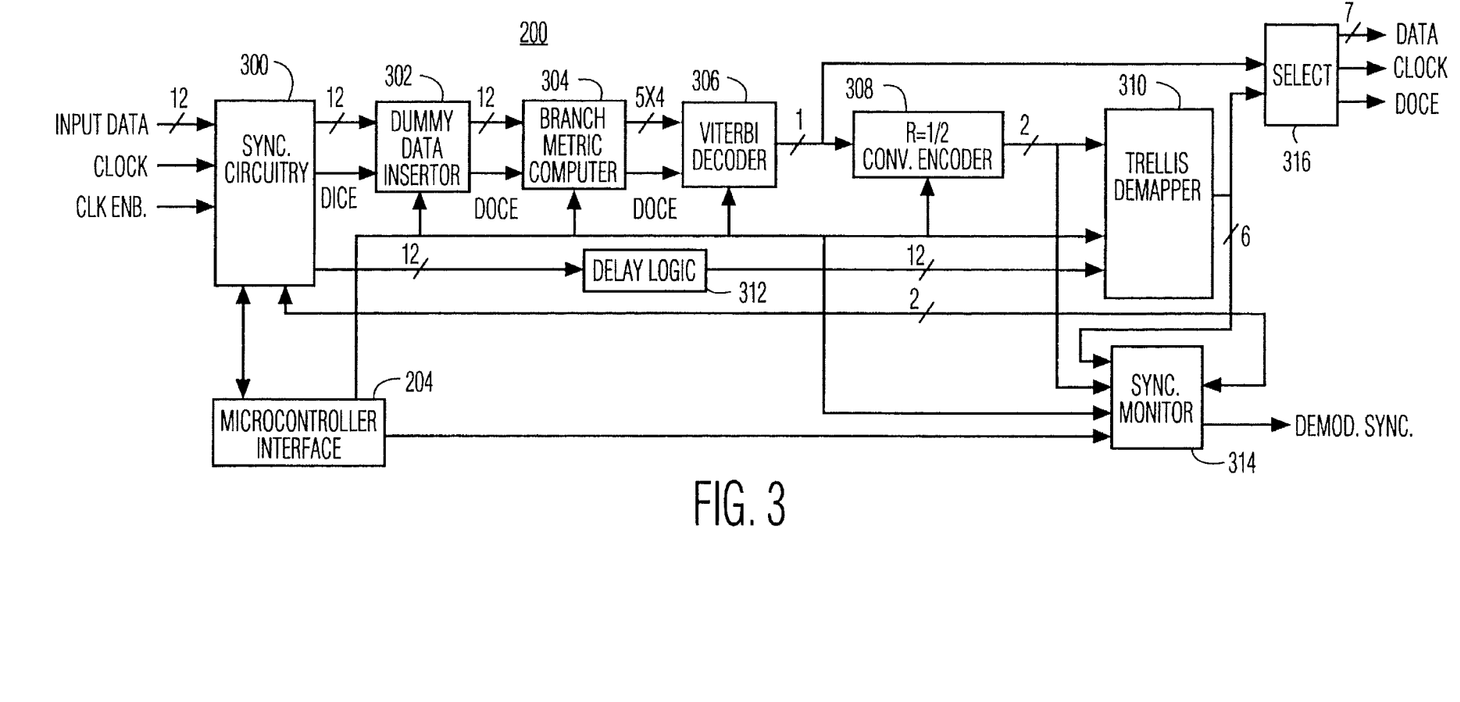
FIG. 3 is a block diagram of the structural elements of the convolutional decoder shown in FIG. 2 which shows the coupling of the microcontroller interface of FIG. 2 to the structural elements of the convolutional decoder.
Figure 3A:
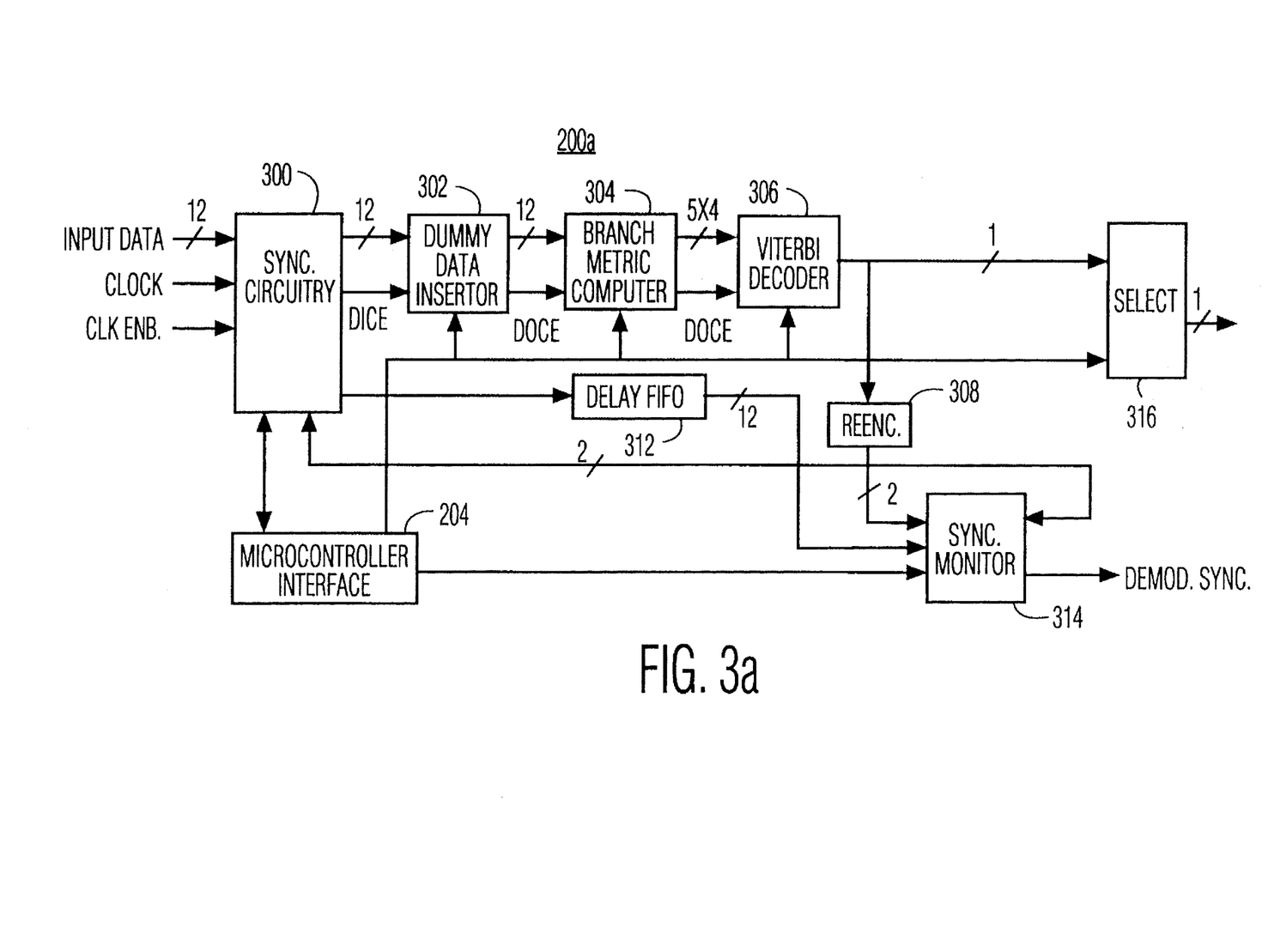
FIG. 3a is a functional diagram of the operative elements of the convolutional decoder shown in FIG. 3 when programmed by the microcontroller interface of FIG. 3 to operate in a punctured code decoding mode.
Figure 3B:
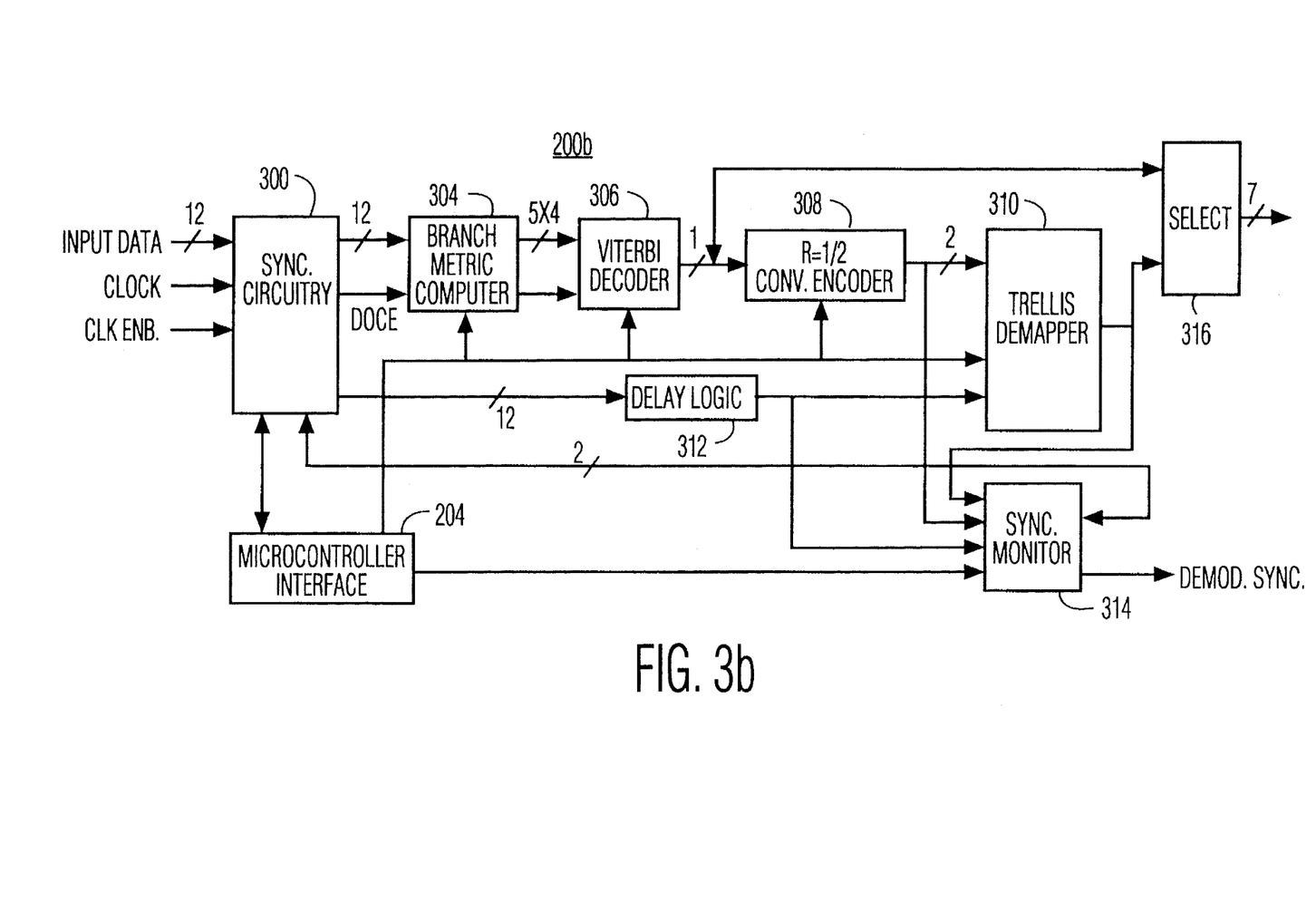
FIG. 3b is a functional diagram of the operative elements of the convolutional decoder shown in FIG. 3 when programmed by the microcontroller interface of FIG. 3 to operate in a pragmatic trellis code decoding mode.

The relationship among the structural elements of receiver convolutional decoder 200 employed by the present invention, and the control of these elements by external microcontroller interface 204, is shown in FIG. 3. As shown in FIG. 3, the structural elements of receiver convolutional decoder 200 include synchronization circuitry 300, dummy data insertor 302, branch metric computer 304, Viterbi decoder 306, convolutional encoder 308, trellis demapper 310, delay logic 312, synchronization monitor 314 and select means 316. Microcontroller interface 204 provides a list of specifications to the aforesaid structural elements which configures the operation of the convolutional encoder as either a decoder for punctured codes or, alternatively, as a decoder for trellis decodes. FIGS. 3a and 3b, respectively, show the manner in which the elements of the convolutional encoder shown in FIG. 3 are (1) configured for operation as a decoder for punctured codes or (2) configured for operation as a decoder for trellis codes.

The output data from demodulator 202 is applied as I,Q input data to synchronization circuitry 300. For illustrative purposes, it is assumed that each of the I and Q data is defined by 6 bits (i.e., the input data is applied over a total of 12 parallel input conductors). This permits each of 64×64=4096 distinct points in the I,Q plane to be defined by the 6-bit I and 6-bit Q components of the 12-bit input data. Synchronization circuitry 300 also receives clock and clock-enable (Clk Enb) inputs thereto. In addition, synchronization circuitry 300 both receives control data from microcontroller interface 204 and supplies data thereto, and is directly coupled to synchronization monitor 314.

Each of elements 302, 304, 306, 308 and 310 has control data applied thereto from microcontroller interface 204. Further, although not shown in FIG. 3, the clock is applied to these elements. Properly synchronized I and Q data is forwarded from synchronization circuitry 300 through dummy data insertor 302 to branch metric computer 304 in response to data input clock enable (DICE) and data output clock enable (DOCE). Further, the properly synchronized I and Q data is forwarded through delay logic 312 to trellis demapper 310 and synchronization monitor 314.

Dummy data insertor 302 is primarily used for punctured codes and is responsible for the insertion of the dummy data corresponding to a specified deletion map for such punctured codes. For trellis codes, dummy data insertor 302 merely passes through its input data to its output. The choice of code and the corresponding deletion map are conveyed to dummy data insertor 302 via microcontroller interface 204. Dummy data insertor 302 clocks data out with an internal clock at a rate which depends on the coding scheme employed. Since the input and output data rates are different (for punctured codes), the data input clock enable (DICE) and the data output clock enable (DOCE) signals are unique. The DICE signal is the clock enable from receiver demodulator 202, while the DOCE signal is generated internally in dummy data insertor 302 (and is derived from the clock signal). Specifically, dummy data insertor 302 consists of a FIFO storage mechanism, a write clock to write in the soft decision samples in appropriate locations, and a read clock (which operates at a rate higher than the write clock and depends on the punctured coding used for its clocking rate) to read out the data for branch metric computations. The dummy samples are also inserted in appropriate locations before being read out.

Branch metric computer 306 (the details of which are discussed below in FIGS. 4 and 4a) derives 4 separate 5-bit outputs in response to each of successively-received symbol packets. These 4 separate 5-bit outputs and the DOCE signal from branch metric computer 306 are applied as inputs to Viterbi decoder 306. Viterbi decoder 306, which is a Rate R=½, constraint length k=7 decoder, performs the Viterbi algorithm for punctured and trellis codes, wherein the 5-bit metric inputs from branch metric computer 306 are used to update the states and to make bit decisions. Viterbi decoder 306 employs add-compare-select (ACS) means, path metric storage means, and the memory for the survivor paths at each level in the trellis. In addition, Viterbi decoder 306 also takes care of metric renormalizations to avoid a buildup and overflow of the accumulated metrics.

A 1-bit output from Viterbi decoder 306 is applied as an input to convolutional encoder 308. For trellis and punctured codes, convolutional encoder 308 serves to regenerate the best estimates of the two transmitted of the rate ½ embedded code. The output from encoder 308 is also applied to synchronization monitor 314 for use in checking the synchronization status of punctured codes. In addition, the 1-bit output from Viterbi decoder 306 is applied as an input to select means 316.

The 2-bit output from convolutional encoder 308 is applied to trellis demapper 310, which is responsible for making symbol decisions for the trellis-coded mode of operation shown in FIG. 3b. In the trellis coded mode of operation, trellis demapper 310 uses the 2-bit output from convolutional encoder 308 for subset selection together with the delayed I and Q received symbol data forwarded thereto through delay logic 312 to make these symbol decisions. A 6-bit output from trellis demapper 310 is applied as an input to both synchronization monitor 314 and select means 316.

Delay logic 312 accounts for the delay introduced by Viterbi decoder 306/encoder 308 and associated circuitry and synchronizes the data stream at the output of the encoder with the received symbol stream. Control input through microcontroller interface 204 selects one of 4 possible path memory lengths of Viterbi decoder 306 which is also used to appropriately select the delay time in delay logic 312.

Synchronization monitor 314, which is coupled to synchronization circuitry 300, the output from trellis demapper 310, encoder 308, the output from delay logic 312 and microcontroller interface 204, uses the branch metric information in conjunction with an observation interval specification from microcontroller interface 204 to decide the synchronization status. It also provides information to synchronization circuitry 300 for optional automatic synchronization. In an automatic synchronization mode of operation, the internal synchronization circuitry is employed to perform the synchronization function. Alternatively, the synchronization could be performed from external circuitry. Synchronization monitor 314 is also used to provide a signal to the demodulator for resolving phase ambiguities. This signal is used for only the purpose of accounting for phase ambiguities in receiver demodulator 202. Further, synchronization monitor 314 supplies a demodulated synchronization signal for use by downstream components of receiver 100.

Select means 316, which receives the 1-bit output of Viterbi decoder 306 and the 6-bit output of trellis demapper 310 applied as inputs thereto, forwards all of these 7 bits to its output when the convolutional decoder is operating in its trellis-code mode and forwards only the 1 bit from the output of Viterbi decoder 306 to its output when the convolutional decoder is operating in its punctured code mode. This output data along with a clock and a DOCE signal are supplied from select means 316 for use by downstream components of receiver 100.

Figure 4:
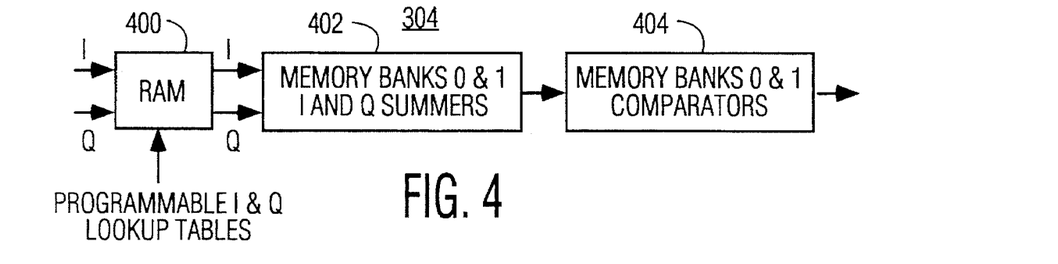
FIG. 4 is a block diagram of the structural elements of the branch metric computer shown in FIG. 3.

In accordance with the principles of the present invention, the structure of branch metric computer 304 comprises random access memory (RAM) 400, Memory banks 0 & 1 I and Q summers 402 and memory banks 0 & 1 I and Q comparators 404. RAM 400 may also be a read-only memory. RAM 400 is preloaded during an initialization phase with programmable, precomputed I and Q lookup tables from microcontroller interface 204 applied as a control input thereto. In response to I and Q signals forwarded from dummy data insertor 302 (which depunctures QPSK-based punctured coded symbols) to RAM 400 as signal inputs thereto, selected ones of the I and Q entries of these lookup tables are read out as outputs from RAM 400 and applied as inputs to memory banks 0 & 1 I and Q summers 402. The output from memory banks 0 & 1 I and Q summers 402 is applied as an input to memory banks 0 & 1 I and Q comparators 404, and the output from memory banks 0 & 1 I and Q comparators 404 is forwarded as an input to Viterbi decoder 306.

Figure 4A:
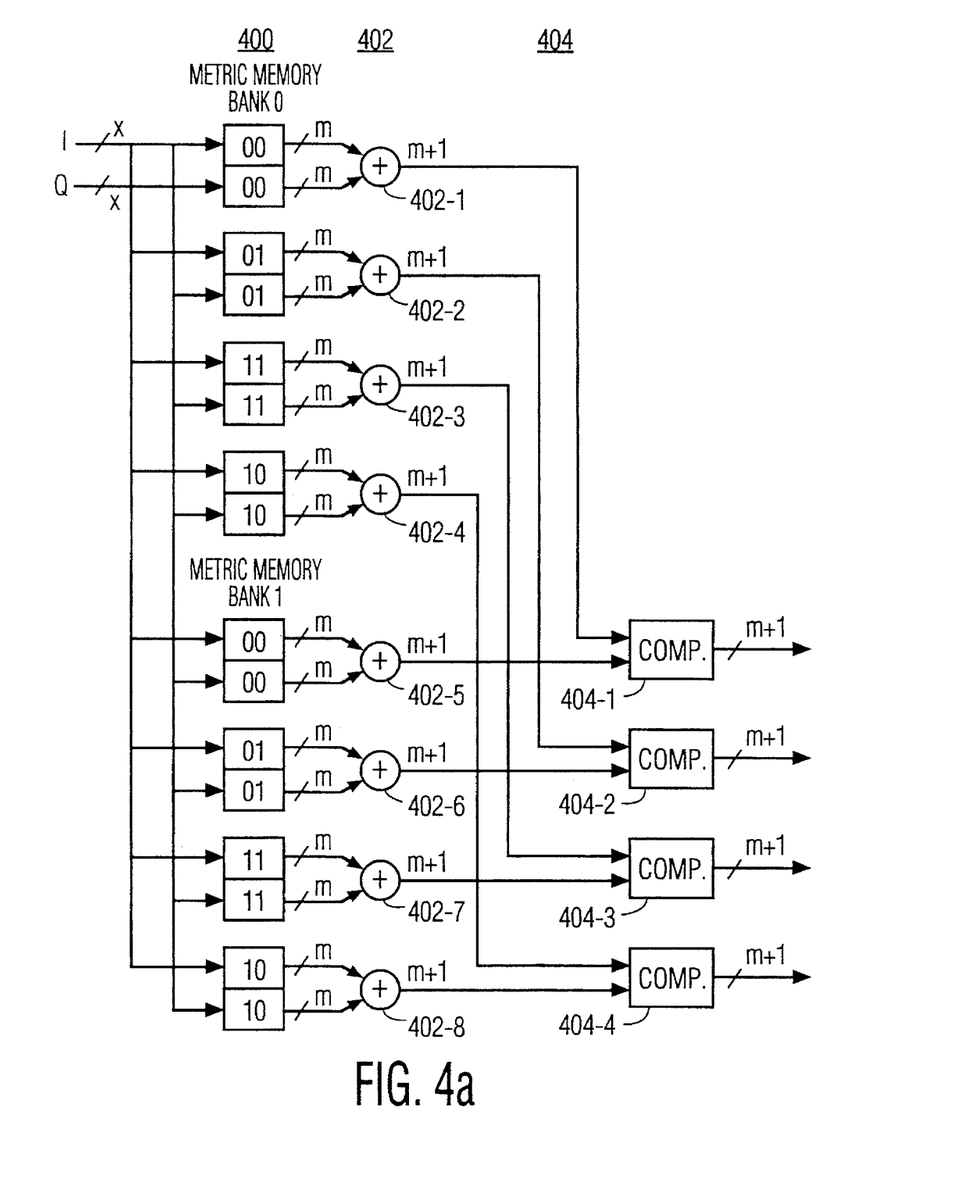
FIG. 4a illustrates the functional organization of the branch metric computer's structural elements shown in FIG. 4.

More specifically, as functionally shown in FIG. 4a, RAM 400 is organized into metric memory bank 0 and metric memory bank 1. Memory bank 0 is made up of a first pair of subsets comprising first I subset 00 and first Q subset 00; a second pair of subsets comprising second I subset 01 and second Q subset 01; a third pair of subsets comprising third I subset 11 and third Q subset 11; and a fourth pair of subsets comprising fourth I subset 10 and fourth Q subset 10. Memory bank 1 is also made up of 4 similar pairs of I and Q subsets, thereby providing a total of 8 pairs of I and Q subsets for RAM 400. Each of the 8 I subsets receives the I signal input to RAM 400 and each of the 8 Q subsets receives the Q signal input to RAM 400. In general, each of the I and Q signal inputs is an x-bit signal (specifically assumed in the illustrative FIG. 3 example to be a 6-bit signal). Each of the 8 I subsets derives an m-bit signal output (illustratively assumed to be a 4-bit signal output) and each of the 8 Q subsets derives an m-bit signal output.

All of the 8 separate I and Q m-bit signal outputs from RAM 400 are forwarded as inputs to the respective summers of memory banks 0 & 1 I and Q summers 402. Specifically, the two outputs from the first pair of subsets of bank 0 are applied as first and second inputs to summer 402-1; the two outputs from the second pair of subsets of bank 0 are applied as first and second inputs to summer 402-2; the two outputs from the third pair of subsets of bank 0 are applied as first and second inputs to summer 402-3; the two outputs from the fourth pair of subsets of bank 0 are applied as first and second inputs to summer 402-4; the two outputs from the first pair of subsets of bank 1 are applied as first and second inputs to summer 402-5; the two outputs from the second pair of subsets of bank 1 are applied as first and second inputs to summer 402-6; the two outputs from the third pair of subsets of bank 1 are applied as first and second inputs to summer 402-7, and the two outputs from the fourth pair of subsets of bank 1 are applied as first and second inputs to summer 402-8. A separate (m+1)-bit output signal (i.e., 5-bit signal in the assumed case) is derived from each of these 8 summers.

All of the 8 separate (m+1)-bit output signals from the summers are forwarded as inputs to the respective comparators of memory banks 0 & 1 I and Q comparators 404. Specifically, the outputs from summers 402-1 and 402-5 are applied as first and second inputs to comparator 404-1; the outputs from summers 402-2 and 402-6 are applied as first and second inputs to comparator 404-2; the outputs from summers 402-3 and 402-7 are applied as first and second inputs to comparator 404-3, and the outputs from summers 402-4 and 402-8 are applied as first and second inputs to comparator 404-4. Each of these comparators passes to its output the lower-valued one of its two (m+1)-bit inputs. The respective outputs from the 4 comparators constitute the output from branch metric computer 304 (i.e., four 5-bit outputs in the assumed case) which are applied as inputs to Viterbi decoder 306.

Structurally, RAM 400 is of a fixed bit storage size having an effective depth of $2^x$ storage locations (i.e., corresponding to locations 1 through 64 in the assumed example in which x=6). Each of the I and Q signal inputs to bank 0 and each of the I and Q signal inputs to bank 1 of RAM 400 has a separate lookup table associated therewith. The width of RAM 400 is sufficient to store four 4m-bit wide (m=4 in the assumed example) precomputed lookup tables, each of which is made up of $2^x$ entries, that have been supplied thereto over the programmable I and Q lookup table control input. Thus, the bit-storage size of RAM 400 is $(2^x)(4)(4m)$ or, in the assumed case, a bit-storage size of 4096 bits. In the case of implementing a punctured QPSK-based code, a simple technique is to pass the maximum I and Q values and store the punctured metrics in appropriate locations in the lookup tables. This necessitates a possible clipping of the actual I and Q data, but can be handled in the front end of decoder 200. Further, the lookup tables can be programmed to permit a desired maximum branch metric value by disregarding certain lesser significant I and Q input data.

As discussed above, branch metric computer 304 is a component of Viterbi-algorithm based convolutional decoder 200 which is used to decode QPSK-based punctured codes for satellite modem operation over a noisy channel and higher alphabet (16, 32, 64, 128 and 256 PAM or QAM or 8-PSK) based rate n/n+1 pragmatic trellis codes for terrestrial or cable operation over a noisy channel. As known, due to channel noise, the location point of a received demodulated symbol in the I,Q plane will be displaced from its transmitted location point in the I,Q plane. The location point of each successively-received demodulated symbols in the I,Q plane is defined with a resolution of $2^{2x}$ (i.e., 64× 46=4096 in the assumed example) by the I and Q signal inputs to RAM 400. The important fact to note about RAM 400 is that its memory requirement is independent of alphabet size.

The 4 m-bit (4-bit in the assumed case) entries of the respective I and Q lookup tables of the 0 bank corresponding to a currently-received demodulated symbol define the respective I and Q components of the respective distances in the I, Q plane of the location points of each of 4 specified valid symbol constellation subsets surrounding the location points of the currently-received demodulated symbol from the location point of this currently-received demodulated symbol.

In the QPSK case, (in which each subset location point defines only a single symbol location point) and in the higher alphabet PAM or QAM cases (in which each subset location point corresponds to the locations of a subset of ¼ of the symbols in that alphabet needed by Viterbi decoder 206, with trellis demapper 310 choosing the correct point within the subset based on delayed, received data applied thereto), a single I component and a single Q component are sufficient to define the four subsets without ambiguity. Therefore, in these cases only bank 0 of RAM 400 is required. However, in the case of 8-PSK, a single I component and a single Q component used independently are insufficient to define four symbol subsets without ambiguity. Therefore, in the 8-PSK case, bank 0 is used to define 0°, 90°, 180°, 270° location points and bank 1 (which operates in a manner similar to that of above-described bank 0) is used to define 45°, 135°, 225°, 315° location points. Comparators 404-1 to 404-4, employing data derived from both bank 0 and bank 1 of RAM 400, are used to resolve this ambiguity in a manner described below.

Summers 402-1 to 402-8 employ the I and Q components of distance to valid constellation location points read out of RAM 400 to compute the so-called Manhattan distance (I+Q) defined by each of the 8 subsets. The Manhattan distance assignment is not the true Euclidean distance $(I^2+Q^2)^{1/2}$, but a distance measure that weights closer points in the I,Q plane more heavily than points in the I,Q plane further away from the received symbol location point. The Manhattan distance metric uses the sum of the differences between the I and Q coordinates of two points in the I, Q two-dimensional space. This distance measure is monotonic with distance, but does weigh points differently depending on their position with respect to the point to which the distance is being computed. However, since the use of the Manhattan distance metric makes the operations on the I and Q coordinates to be decoupled and independent, it drastically reduces the memory requirements of for storing the possible distances from any received location point to a valid constellation location point.

Each of comparators 404-1 to 404-4 is designed to pass the smaller of the two metrics applied from bank 0 and bank 1 as inputs thereto. Thus, in the case of an 8-PSK based code, each of comparators 404-1 to 404-4 will derive as an output either the metric input from bank 0 or from bank 1, depending upon which is smaller. However, in the case of QPSK, PAM or QAM based codes, the I and Q lookup tables stored in bank 1 of RAM 400 are programmed to be filled with maximum-valued metrics so that they are effectively inactive and, therefore, each of comparators 404-1 to 404-4 passes the metric chosen out of bank 0 of RAM 400. In a multi-channel receiver not designed to receive an 8-PSK based code, both these comparators and memory bank 1 of RAM 400 may be eliminated (thereby reducing the required memory storage capacity of RAM 400 in half).

Although the convolutional decoder disclosed herein is primarily for use in a multi-channel television receiver for receiving punctured-coded or pragmatic trellis-coded compressed-digital television data, it is not intended that the type of coded data capable of being decoded by the disclosed convolutional decoder be limited to only television data, but may be employed by any other type of coded data capable of being decoded by the disclosed convolutional decoder.

In addition to being suitable for use in a receiver of satellite, terrestrial and cable television data as mentioned previously, the disclosed decoder apparatus is also suitable for use in other applications including telephone, direct microwave and fiber optic transmission.

What is claimed is:

1. In a convolutional decoder of a series of convolutionally-encoded symbol packets applied as in-phase (I) and quadrature-phase (Q) digital input signals thereto, wherein said convolutional decoder includes a branch metric computer and a Viterbi decoder; the improvement wherein said branch metric computer comprises:

a memory having an effective depth of $2^x$ storage locations, where x is a first given integer larger than one, each storage location having an effective width sufficient to store an entry of at least one I-defining lookup table and an entry of at least one Q-defining lookup table, wherein each of said entries of an I-defining lookup table and a Q-defining lookup table consists of a group of first, second, third and fourth m-bit metric values, where m is a second given integer larger than one, said memory including a control input for preloading said $2^x$ storage locations with at least one I-defining lookup table and at least one Q-defining lookup table, and $2^x$-bit I and $2^x$-bit Q signal inputs for reading out said one I-defining lookup table entry stored in the storage location defined by the value of a $2^x$-bit signal currently applied to said $2^x$-bit I signal input and said one Q-defining lookup table entry stored in the storage location defined by the value of a $2^x$-bit signal currently applied to said $2^x$-bit Q signal input;

a group of summers including a first summer for adding the first m-bit metric value of the readout one I-defining lookup table entry to the first m-bit metric value of the readout one Q-defining lookup table to derive an (m+1)-bit sum output therefrom, a second summer for adding the second m-bit metric value of the readout one I-defining lookup table entry to the second m-bit metric value of the readout one Q-defining lookup table to derive an (m+1)-bit sum output therefrom, a third summer for adding the third m-bit metric value of the readout one I-defining lookup table entry to the third m-bit metric value of the readout one Q-defining lookup table to derive an (m+1)-bit sum output therefrom, and a fourth summer for adding the fourth m-bit metric value of the readout one I-defining lookup table entry to the fourth m-bit metric value of the readout one Q-defining lookup table to derive an (m+1)-bit sum output therefrom; and means for forwarding the respective sum outputs from four summers of said group to said Viterbi decoder.

2. The convolutional decoder defined in claim 1, wherein x=6 and m=4.

3. The convolutional decoder defined in claim 1, wherein said memory is a random access memory (RAM).

4. The convolutional decoder defined in claim 1, wherein said convolutional decoder includes digital processing means capable of selectively decoding punctured-coded quadrature phase short K Keying QPSK symbol packets and a plurality of higher alphabet PAM and quadrature amplitude Modulation QAM n/n+1 pragmatic trellis-coded symbol packets, wherein n is an integer number and an external microcontroller having an interface with said convolutional decoder for applying I and Q programmable lookup tables to said control input of said branch metric computer that are precomputed in accordance with the selected code to be decoded.

5. The convolutional decoder defined in claim 4, wherein said digital processing means is also capable of selectively decoding 8-Phase Shift Keying (8-PSK) n/n+1 pragmatic trellis-coded symbol packets; and wherein:

each storage location of said memory of said branch metric computer has an effective width sufficient to store entries of both first and second I-defining lookup tables and entries of both first and second Q-defining lookup tables, said control input preloading said $2^x$ storage locations with both said first and second I-defining lookup tables and both said first and second Q-defining lookup tables, and reading out both said first and second I-defining lookup table entries stored in the storage location defined by the value of the $2^x$-bit signal currently applied to said $2^x$-bit I signal input and both said first and second Q-defining lookup table entries stored in the storage location defined by the value of the $2^x$-bit signal currently applied to said $2^x$-bit Q signal input; and said group of summers of said branch metric computer includes a first summer for adding the first m-bit metric value of the readout first I-defining lookup table entry to the first m-bit metric value of the readout first Q-defining lookup table to derive an (m+1)-bit sum output therefrom, a second summer for adding the second m-bit metric value of the readout first I-defining lookup table entry to the second m-bit metric value of the readout first Q-defining lookup table to derive an (m+1)-bit sum output therefrom, a third summer for adding the third m-bit metric value of the readout first I-defining lookup table entry to the third m-bit metric value of the readout first Q-defining lookup table to derive an (m+1)-bit sum output therefrom, a fourth summer for adding the fourth m-bit metric value of the readout first I-defining lookup table entry to the fourth m-bit metric value of the readout first Q-defining lookup table to derive an (m+1)-bit sum output therefrom, a fifth summer for adding the first m-bit metric value of the readout second I-defining lookup table entry to the first m-bit metric value of the readout second Q-defining lookup table to derive an (m+1)-bit sum output therefrom, a sixth summer for adding the second m-bit metric value of the readout second I-defining lookup table entry to the second m-bit metric value of the readout second Q-defining lookup table to derive an (m+1)-bit sum output therefrom, a seventh summer for adding the third m-bit metric value of the readout second I-defining lookup table entry to the third m-bit metric value of the readout second Q-defining lookup table to derive an (m+1)-bit sum output therefrom, and an eighth summer for adding the fourth m-bit metric value of the readout second I-defining lookup table entry to the fourth m-bit metric value of the readout second Q-defining lookup table to derive an (m+1)-bit sum output therefrom; and said means of said branch metric computer for forwarding the respective sum outputs from four summers of said group to said Viterbi decoder includes a first comparator for comparing the sum output of said first summer with that of said fifth summer for forwarding that one of these sum outputs having the lesser value, a second comparator for comparing the sum output of said second summer with that of said sixth summer for forwarding that one of these sum outputs having the lesser value, a third comparator for comparing the sum output of said third summer with that of said seventh summer for forwarding that one of these sum outputs having the lesser value, and a fourth comparator for comparing the sum output of said fourth summer with that of said eighth summer for forwarding that one of these sum outputs having the lesser value.

6. The convolutional decoder defined in claim 4, wherein, under the control of the microcontroller interface, said convolutional decoder is selectively configured to be either in a punctured code decoding mode or in a pragmatic trellis code decoding mode; and wherein said digital processing means includes:

dummy data insertor means operative only when said convolutional decoder is in its punctured-code decoding mode for depuncturing said I and Q digital input signals applied to said convolutional decoder prior to their being applied to said $2^x$-bit I and $2^x$-bit Q signal inputs of said memory of said branch metric computer; and trellis demapper means responsive to a reencoded output of said Viterbi decoder and I and Q digital input signals applied to said convolutional decoder that have been delayed, said trellis demapper means being operative only when said convolutional decoder is in its pragmatic trellis code decoding mode.

7. The convolutional decoder defined in claim 6, wherein said convolutional decoder is a component of a multi-channel receiver for receiving forward-error-corrected encoded data transmitted thereto over any of a satellite transmission channel, a terrestrial transmission channel and a cable transmission channel.

8. The convolutional decoder defined in claim 7, wherein said digital processing means is also capable of selectively decoding 8 phase Shift Key (8-PSK) n/n+1 pragmatic trellis-coded symbol packets; and wherein:

each storage location of said memory of said branch metric computer has an effective width sufficient to store entries of both first and second I-defining lookup tables and entries of both first and second Q-defining lookup tables, said control input preloading said $2^x$ storage locations with both said first and second I-defining lookup tables and both said first and second Q-defining lookup tables, and reading out both said first and second I-defining lookup table entries stored in the storage location defined by the value of a $2^x$-bit signal currently applied to said $2^x$-bit I signal input and both said first and second Q-defining lookup table entries stored in the storage location defined by the value of a $2^x$-bit signal currently applied to said $2^x$-bit Q signal input; and said group of summers of said branch metric computer includes a first summer for adding the first m-bit metric value of the readout first I-defining lookup table entry to the first m-bit metric value of the readout first Q-defining lookup table to derive an (m+1)-bit sum output therefrom, a second summer for adding the second m-bit metric value of the readout first I-defining lookup table entry to the second m-bit metric value of the readout first Q-defining lookup table to derive an (m+1)-bit sum output therefrom, a third summer for adding the third m-bit metric value of the readout first I-defining lookup table entry to the third m-bit metric value of the readout first Q-defining lookup table to derive an (m+1)-bit sum output therefrom, a fourth summer for adding the fourth m-bit metric value of the readout first I-defining lookup table entry to the fourth m-bit metric value of the readout first Q-defining lookup table to derive an (m+1)-bit sum output therefrom, a fifth summer for adding the first m-bit metric value of the readout second I-defining lookup table entry to the first m-bit metric value of the readout second Q-defining lookup table to derive an (m+1)-bit sum output therefrom, a sixth summer for adding the second m-bit metric value of the readout second I-defining lookup table entry to the second m-bit metric value of the readout second Q-defining lookup table to derive an (m+1)-bit sum output therefrom, a seventh summer for adding the third m-bit metric value of the readout second I-defining lookup table entry to the third m-bit metric value of the readout second Q-defining lookup table to derive an (m+1)-bit sum output therefrom, and an eighth summer for adding the fourth m-bit metric value of the readout second I-defining lookup table entry to the fourth m-bit metric value of the readout second Q-defining lookup table to derive an (m+1)-bit sum output therefrom; and said means of said branch metric computer for forwarding the respective sum outputs from four summers of said group to said Viterbi decoder includes a first comparator for comparing the sum output of said first summer with that of said fifth summer for forwarding that one of these sum outputs having the lesser value, a second comparator for comparing the sum output of said second summer with that of said sixth summer for forwarding that one of these sum outputs having the lesser value, a third comparator for comparing the sum output of said third summer with that of said seventh summer for forwarding that one of these sum outputs having the lesser value, and a fourth comparator for comparing the sum output of said fourth summer with that of said eighth summer for forwarding that one of these sum outputs having the lesser value.

9. The convolutional decoder defined in claim 7; wherein said multi-channel receiver is a digital television receiver for receiving forward-error-corrected compressed-digital television data transmitted thereto over any of said satellite, terrestrial and cable transmission channels.

10. The convolutional decoder defined in claim 9, wherein said digital processing means is also capable of selectively decoding 8-Phase Shift Keying (8-PSK) n/n+1 pragmatic trellis-coded symbol packets; and wherein:

each storage location of said memory of said branch metric computer has an effective width sufficient to store entries of both first and second I-defining lookup tables and entries of both first and second Q-defining lookup tables, said control input preloading said $2^x$ storage locations with both said first and second I-defining lookup tables and both said first and second Q-defining lookup tables, and reading out both said first and second I-defining lookup table entries stored in the storage location defined by the value of the $2^x$-bit signal currently applied to said $2^x$-bit I signal input and both said first and second Q-defining lookup table entries stored in the storage location defined by the value of the $2^x$-bit signal currently applied to said $2^x$-bit Q signal input; and said group of summers of said branch metric computer includes a first summer for adding the first m-bit metric value of the readout first I-defining lookup table entry to the first m-bit metric value of the readout first Q-defining lookup table to derive an (m+1)-bit sum output therefrom, a second summer for adding the second m-bit metric value of the readout first I-defining lookup table entry to the second m-bit metric value of the readout first Q-defining lookup table to derive an (m+1)-bit sum output therefrom, a third summer for adding the third m-bit metric value of the readout first I-defining lookup table entry to the third m-bit metric value of the readout first Q-defining lookup table to derive an (m+1)-bit sum output therefrom, a fourth summer for adding the fourth m-bit metric value of the readout first I-defining lookup table entry to the fourth m-bit metric value of the readout first Q-defining lookup table to derive an (m+1)-bit sum output therefrom, a fifth summer for adding the first m-bit metric value of the readout second I-defining lookup table entry to the first m-bit metric value of the readout second Q-defining lookup table to derive an (m+1)-bit sum output therefrom, a sixth summer for adding the second m-bit metric value of the readout second I-defining lookup table entry to the second m-bit metric value of the readout second Q-defining lookup table to derive an (m+1)-bit sum output therefrom, a seventh summer for adding the third m-bit metric value of the readout second I-defining lookup table entry to the third m-bit metric value of the readout second Q-defining lookup table to derive an (m+1)-bit sum output therefrom, and an eighth summer for adding the fourth m-bit metric value of the readout second I-defining lookup table entry to the fourth m-bit metric value of the readout second Q-defining lookup table to derive an (m+1)-bit sum output therefrom; and said means of said branch metric computer for forwarding the respective sum outputs from four summers of said group to said Viterbi decoder includes a first comparator for comparing the sum output of said first summer with that of said fifth summer for forwarding that one of these sum outputs having the lesser value, a second comparator for comparing the sum output of said second summer with that of said sixth summer for forwarding that one of these sum outputs having the lesser value, a third comparator for comparing the sum output of said third summer with that of said seventh summer for forwarding that one of these sum outputs having the lesser value, and a fourth comparator for comparing the sum output of said fourth summer with that of said eighth summer for forwarding that one of these sum outputs having the lesser value.

* * * * *

UNITED STATES PATENT AND TRADEMARK OFFICE
CERTIFICATE OF CORRECTION

PATENT NO. : 5,497,401

DATED : March 5, 1996

INVENTOR(S) : Kumar Ramaswamy et al.

It is certified that error appears in the above-identified patent and that said Letters Patent is hereby corrected as shown below:

On the title page,
   Item [57] ABSTRACT, line 10, delete "," after m-bit values Column 3, line 45, insert ---.--- after (Q) plane Column 4, line 50, delete "306" after branch metric computer and
   insert --- 304 ---

Column 8, line 46, after "said entries of", delete "an" and
   insert --- the ---

Column 8, line 47, after "lookup table and", delete "a" and insert ---the---

Column 9, line 21, after "quadrature phase", delete "short K Keying QPSK"
   and insert ---shift keying (QPSK)---

Column 9, line 22-23, after "higher alphabet", delete "PAM and quadrature
   amplitude Modulation QAM" and insert ---phase amplitude modulation (PAM)
   and quadrature amplitude modulation (QAM)---

Column 9, line line 24 after integer number, insert --- ; ---

Column 10, line 63, delete "8 phase Shift Key" and insert ---8-phase shift
   keying---

UNITED STATES PATENT AND TRADEMARK OFFICE
CERTIFICATE OF CORRECTION

PATENT NO. : 5,497,401
DATED : March 5, 1996
INVENTOR(S) : Kumar Ramaswamy et al.

It is certified that error appears in the above-identified patent and that said Letters Patent is hereby corrected as shown below:

Column 11, line 8, after "by the value of", delete "a" and insert ---the---

Column 11, line 11, after "by the value of", delete "a" and insert ---the---

Signed and Sealed this

Twenty-seventh Day of January, 1998

Attest:

BRUCE LEHMAN

Attesting Officer

Commissioner of Patents and Trademarks